United States Patent
Lee et al.

(10) Patent No.: US 8,198,626 B2
(45) Date of Patent: Jun. 12, 2012

(54) REFERENCE WAFER FOR CALIBRATION AND METHOD FOR FABRICATING THE SAME

(75) Inventors: Hyun-Chul Lee, Gyeonggi-do (KR); Jung-Taik Cheong, Gyeonggi-do (KR); Gue-Hong Song, Gyeonggi-do (KR); Ky-Hyun Han, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 369 days.

(21) Appl. No.: 12/492,888

(22) Filed: Jun. 26, 2009

(65) Prior Publication Data
US 2010/0167064 A1     Jul. 1, 2010

(30) Foreign Application Priority Data
Dec. 31, 2008   (KR) .................. 10-2008-0138575

(51) Int. Cl.
*H01L 23/58* (2006.01)
*H01L 29/10* (2006.01)
*G02B 1/10* (2006.01)

(52) U.S. Cl. .......................... 257/48; 359/585

(58) Field of Classification Search .............. 359/577, 359/585–586, 588–580, 838–839, 850, 871, 359/883–885, 890, 892; 257/48; 438/14–18
See application file for complete search history.

(56) References Cited

U.S. PATENT DOCUMENTS
2002/0136905 A1 *   9/2002  Medwick et al. ............. 428/432

FOREIGN PATENT DOCUMENTS
KR    1020070019806 A    2/2007
KR    1020070047206      5/2007

OTHER PUBLICATIONS
Notice of Preliminary Rejection issued from Korean Intellectual Property Office on Oct. 29, 2010.

* cited by examiner

*Primary Examiner* — Stephone Allen
*Assistant Examiner* — Kimberly N Kakalec
(74) *Attorney, Agent, or Firm* — IP & T Group LLP

(57) ABSTRACT

A reference wafer maintains laser accuracy and calibrates a camera and a laser of a semiconductor equipment. The reference wafer includes a first anti-reflection layer, an adhesive layer, a light absorption layer and a second anti-reflection layer that are stacked over a substrate, a light reflection layer formed over the second anti-reflection layer, and a protection layer formed over the light reflection layer.

7 Claims, 8 Drawing Sheets

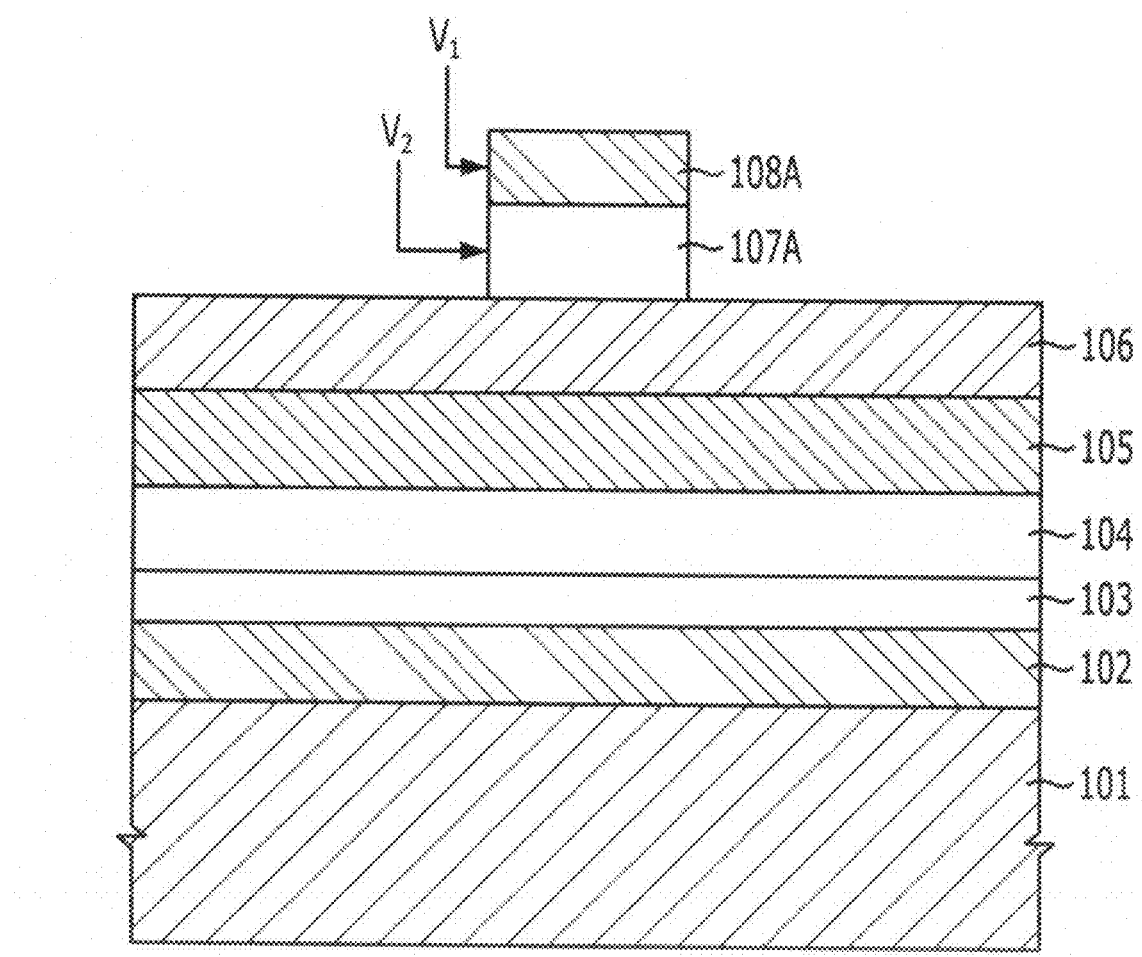

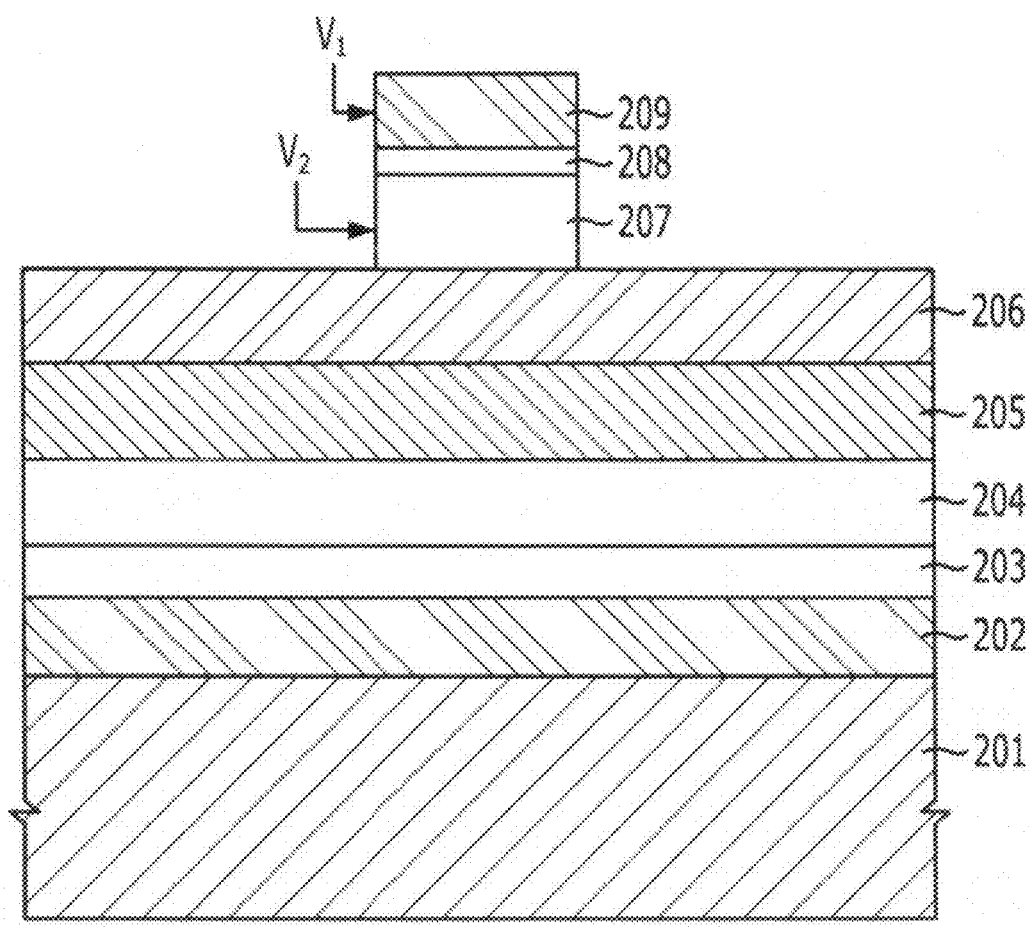

REFERENCE WAFER FOR CALIBRATION AND METHOD FOR FABRICATING THE SAME

CROSS-REFERENCE TO RELATED APPLICATIONS

The present invention claims priority of Korean patent application number 10-2008-0138575, filed on Dec. 31, 2008, the disclosure of which is incorporated herein by reference in its entirety.

BACKGROUND OF THE INVENTION

The present invention relates to a semiconductor equipment, and more particularly, to a reference wafer for maintaining laser accuracy and calibrating a camera and a laser of the semiconductor equipment, and a method for fabricating the reference wafer.

As a degree of integration of a semiconductor device becomes higher and a wafer size increases, it is required to precisely control a semiconductor equipment when fabricating the semiconductor device. Particularly, a laser repair equipment used in a process of repairing a semiconductor fuse should focus a laser on an accurate location to cut the semiconductor fuse. However, a failure may occur due to an error of no more than dozens of nanometers according to a device size.

FIG. 1A illustrates a conventional reference wafer for calibrating a semiconductor equipment. FIG. 1B illustrates a plane view of the reference wafer described in FIG. 1A. FIG. 1C illustrates an image of a conventional light reflection layer.

Referring to FIG. 1A, a silicon oxide ($SiO_2$) layer is formed as a first anti-reflection layer 12 on a silicon substrate 11 and Ti/TiN layers 13 and 14 are formed as an adhesive layer on the first anti-reflection layer 12. Then, a tungsten (W) layer is formed as a light absorption layer 15 on the adhesive layer 13 and 14. A silicon oxide ($SiO_2$) layer is formed as a second anti-reflection layer 16 on the W layer 15 and an aluminum (Al) layer is stacked on the second anti-reflection layer 16. Subsequently, an Al pattern is formed as a light reflection layer 17 by performing a masking and etching process on the Al layer. It is noted that the light reflection layer 17 may have a cross shape when referring to FIG. 1B.

As illustrated in FIGS. 1A and 1B, a typical repair method is to irradiate a laser 19 in a vertical direction from a detector 18, to two-dimensionally move (for example, in the directions indicated by the arrows 20) the detector 18 several times, to receive a reflected laser 21 to thereby recognize the light reflection layer 17, to find a center of the light reflection layer 17, and to calibrate a coordinate of the laser 19 to a coordinate that is closest to a (0, 0) coordinate, thereby finding an accurate location of a fuse and blowing the fuse in a practical repair process.

Since, however, in the conventional reference wafer, the aluminum pattern, i.e., the light reflection layer 17, has a relatively large gradient when it is formed by etching the aluminum layer as represented by a reference numeral 22 in FIG. 1C, and a reflection angle with respect to an incident angle, the laser is not detected/measured properly. Thus, the laser accuracy is deteriorated.

Further, the scattered reflection of the laser is a concern at a gradient of the aluminum pattern 17 and thus the accuracy is deteriorated.

Moreover, as the laser is irradiated repeatedly onto the aluminum layer exposed to the air, the oxidation occurs due to the increase of a temperature on the surface of the aluminum pattern. As a result, a usage period of the reference wafer may become shorter.

SUMMARY OF THE INVENTION

Embodiments of the present invention are directed to providing a reference wafer for calibrating a semiconductor equipment, which can prevent the scattered reflection due to a slope of a sidewall of a light reflection layer, and a method for fabricating the reference wafer.

Embodiments of the present invention are also directed to providing a reference wafer for calibrating a semiconductor equipment, which can minimize the scattered reflection due to a gradient of a light reflection layer when calibrating a laser, and a method for fabricating the reference wafer.

In accordance with an aspect of the present invention, there is provided a reference wafer for calibrating a semiconductor equipment, the reference wafer including: a first anti-reflection layer, an adhesive layer, a light absorption layer and a second anti-reflection layer that are stacked over a substrate; a light reflection layer formed over the second anti-reflection layer; and a protection layer formed over the light reflection layer. Each of the protection layer and the light reflection layer may have a sidewall of a vertical profile. The protection layer may include a silicon oxynitride (SiON) layer.

In accordance with another aspect of the present invention, there is provided a reference wafer for calibrating a semiconductor equipment, the reference wafer including: a first anti-reflection layer, an adhesive layer, a light absorption layer and a second anti-reflection layer that are stacked over a substrate; a light reflection layer formed over the second anti-reflection layer; and a micrograin layer formed over the light reflection layer. Each of the micrograin layer and the light reflection layer may have a sidewall of a vertical profile. The protection layer may include a silicon oxynitride (SiON) layer. The micrograin layer may have a grain size smaller than that of the light reflection layer. The light reflection layer may include an Al layer and the micrograin layer may include one of a titanium nitride (TiN) layer, a titanium (Ti) layer and a stacked structure of the TiN layer and the Ti layer.

In accordance with still another aspect of the present invention, there is provided a method for fabricating a reference wafer for calibrating a semiconductor equipment, the method including: stacking a first anti-reflection layer, an adhesive layer, a light absorption layer and a second anti-reflection layer over a substrate; stacking a light reflection layer and a protection layer over the second anti-reflection layer; etching the protection layer by using a photoresist pattern as an etch barrier to form a protection layer pattern having a vertical profile; and etching the light reflection layer by using the protection pattern as an etch barrier.

BRIEF DESCRIPTION OF THE DRAWINGS

FIG. 2 illustrates a view of a reference wafer for calibrating a semiconductor equipment in accordance with a first embodiment of the present invention.

FIG. 6 illustrates a view of a reference wafer for calibrating a semiconductor equipment in accordance with a second embodiment of the present invention.

DESCRIPTION OF SPECIFIC EMBODIMENTS

Figure 1A:
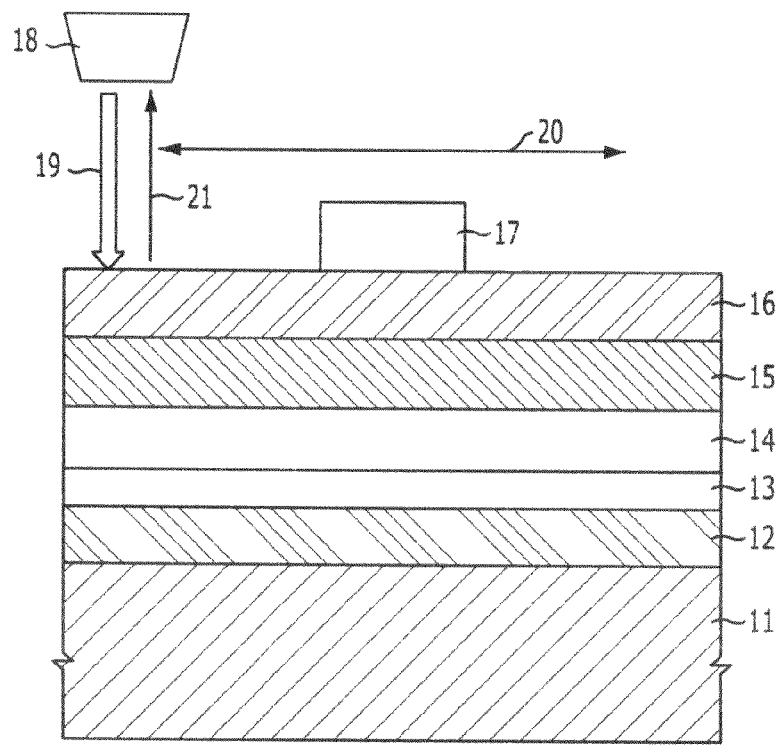
FIG. 1A illustrates a conventional reference wafer for calibrating a semiconductor equipment.
Figure 1B:
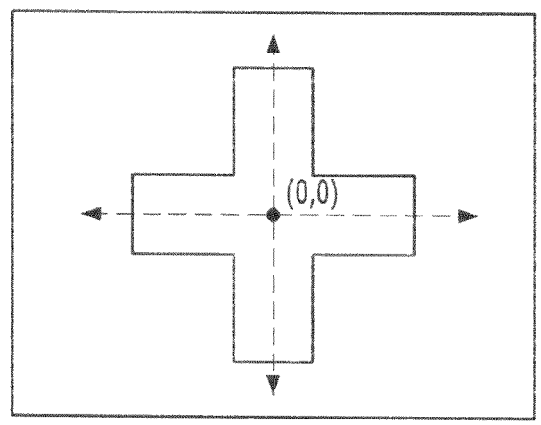
FIG. 1B illustrates a plane view of the reference wafer described in FIG. 1A.
Figure 1C:
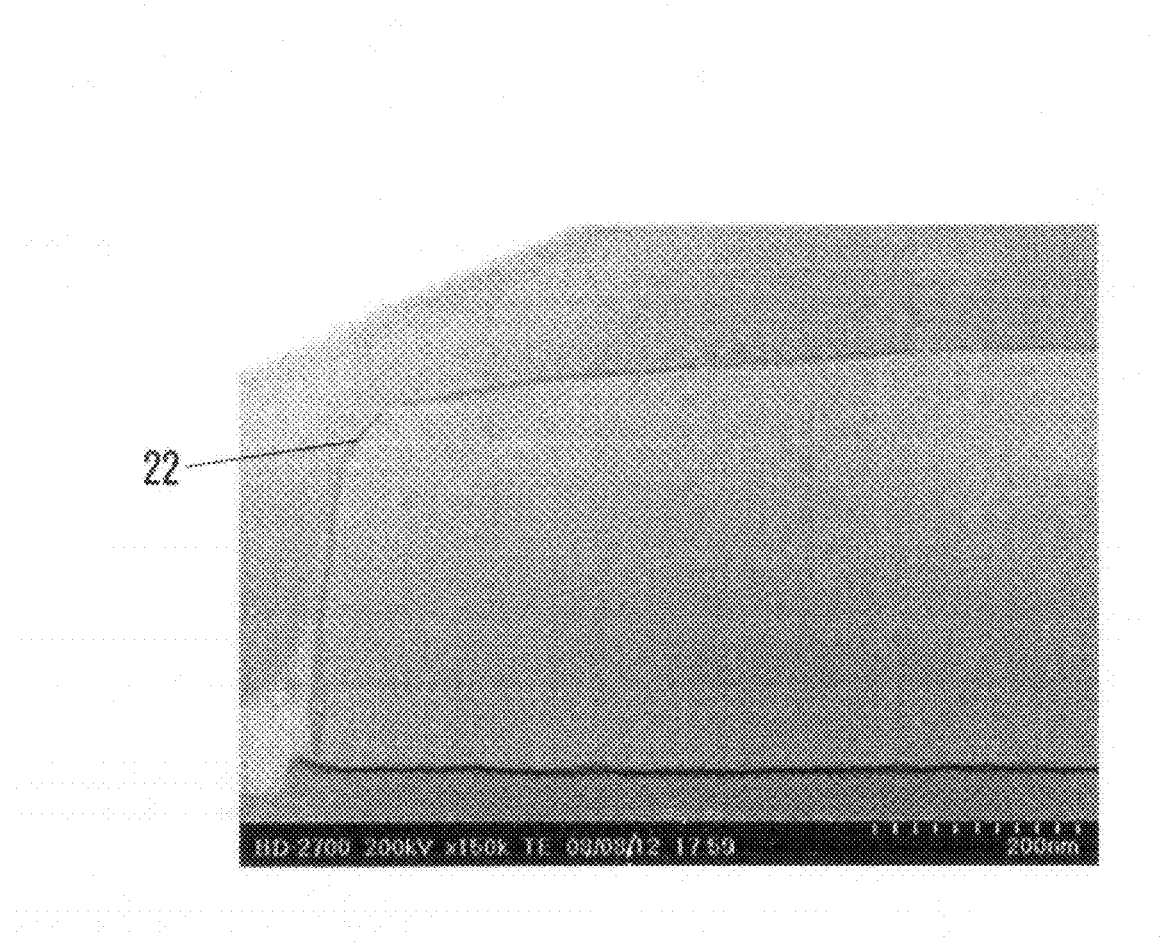
FIG. 1C illustrates an image of a conventional light reflection layer.

Other objects and advantages of the present invention can be understood by the following description, and become apparent with reference to the embodiments of the present invention. In the figures, the dimensions of layers and regions may be exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present.

In accordance with the present invention, a process of etching a light reflection layer such as an aluminum layer is employed after additionally forming a silicon oxynitride (SiON) layer as a protection layer on a top portion of a reference wafer and forming a SiON pattern having a vertical profile through a masking and etching process.

Accordingly, a gradient of the light reflection layer is improved by using a pattern of the SiON layer having a vertical profile in a vertical direction and thus the scattered reflection due to the gradient of the light reflection layer may be prevented/reduced.

Further, the scattered reflection due to a gradient (which is, a sloped end or a slope caused by a grain size of the light reflection layer) of the light reflection layer when calibrating a laser is minimized by an anti-reflection function which the SiON layer generally has.

Since the light reflection layer is protected not to be exposed to the air by forming the SiON layer on the light reflection layer, a speed which the light reflection layer directly reacts with the laser and is oxidized is reduced and thus the reference wafer has a longer usage period.

In accordance with a first embodiment of the present invention, it is possible to make a sidewall of a light reflection layer to have a vertical profile instead of having a gradient by forming a SiON layer having the scattered reflection function on the light reflection layer and to minimize the scattered reflection due to a gradient of the light reflection layer by using the scattered reflection function of the SiON layer, wherein the SiON layer can protect the light reflection layer from being exposed to the air.

In accordance with a second embodiment of the present invention, it is possible to prevent the scattered reflection due to a gradient of a light reflection layer by forming a micrograin layer on the light reflection layer and to make a slope of a sidewall of the light reflection layer to have a vertical profile by using a SiON layer, wherein the micrograin layer can protect the light reflection layer from being exposed to the air.

FIG. 2 illustrates a view of a reference wafer for calibrating a semiconductor equipment in accordance with the first embodiment of the present invention.

Referring to FIG. 2, the reference wafer includes a first anti-reflection layer 102, an adhesive layer 103 and 104, a light absorption layer 105, a second anti-reflection layer 106, a light reflection layer pattern 107A and a protection layer pattern 108A that are sequentially stacked on a silicon substrate 101. Herein, the light reflection layer pattern 107A and the protection layer pattern 108A may have a cross shape in a plane view.

First of all, the first anti-reflection layer 102 and the second anti-reflection layer 106 prevent the reflection of a laser and transmit the laser. For instance, the first and the second anti-reflection layers 102 and 106 may include $SiO_2$. In particular, the first anti-reflection layer 102 may include a $SiO_2$ layer having a thickness of approximately 10,000 Å and the second anti-reflection layer 106 may include a $SiO_2$ layer having a thickness of approximately 2,000 Å.

The light absorption layer 105 can absorb the laser permeating the second anti-reflection layer 106. Accordingly, it is preferred that a reflection rate of the light absorption layer 105 is low, e.g., less than 70%. For instance, the light absorption layer 105 may include a tungsten (W) layer having a reflection rate of less than 60%. A thickness of the light absorption layer 105 may be selected by considering warpage due to the reflection rate and stress. Preferably, the thickness of the light absorption layer 105 formed with the W layer may be approximately 1,500 Å.

The adhesive layer is provided to enhance an adhesive force between the first anti-reflection layer 102 and the light absorption layer 105. For instance, the adhesive layer may include a titanium (Ti) layer 103 and a titanium nitride (TiN) layer 104. The Ti layer 103 enhances an adhesive force between the TiN layer 104 and the first anti-reflection layer 102 and the TiN layer 104 enhances an adhesive force between the Ti layer 103 and the light absorption layer 105. In case the light absorption layer 105 includes the W layer, it is well known that the adhesive layer including the Ti layer 103 and the TiN layer 104 can provide an enhanced adhesive force between the W layer and the first anti-reflection layer 102. The TiN layer 104 may have a thickness of approximately 200 Å and the Ti layer 103 may have a thickness of approximately 100 Å. Each of the Ti layer 103 and the TiN layer 104 may have a minimum thickness to provide an appropriate adhesive force.

The light reflection layer pattern 107A can reflect the incident laser. For instance, the light reflection layer pattern 107A may include a metal layer capable of reflecting higher than 90% of the incident laser. In particular, the light reflection layer pattern 107A may include an aluminum (Al) layer. A thickness of the light reflection layer pattern 107A may be determined by considering its reflection rate. The reflection rate of the light reflection layer pattern 107A is higher than 95% if a thickness of the Al layer is greater than approximately 1,000 Å. Therefore, the thickness of the light reflection layer pattern 107A may be greater than approximately 1,000 Å, e.g., 4,000 Å.

The protection layer pattern 108A prevents the light reflection layer pattern 107A from being exposed to the air. For example, the protection layer pattern 108A may include SiON. In particular, the protection layer pattern 108A may be formed with a SiON layer having a thickness of approximately 100 Å to approximately 1,000 Å. In general, the SiON layer has a function of preventing the scattered reflection. Therefore, the protection layer pattern 108A plays a role of preventing the scattered reflection as well.

Specially, it is preferable that the protection layer pattern 108A has a sidewall having a vertical profile V1. In the reference wafer, the scattered reflection makes the detection of a location of the light reflection layer pattern 107A difficult when the laser passes a sidewall of the light reflection layer pattern 107A because of a gradient of the sidewall of the light reflection layer pattern 107A. As a result, a correct location waveform cannot be obtained and thus a significant error may occur when performing the calibration. Therefore, in accordance with the present invention, by forming the protection layer pattern 108A whose sidewall has the vertical profile V1 on the light reflection layer pattern 107A, the protection layer pattern 108A acts as an etch barrier when etching the light reflection layer pattern 107A and thus it is possible to secure the light reflection layer pattern 107A having a vertical profile V2 (for example, a vertically straight surface without a slant).

According to FIG. 2, the present invention can minimize the scattered reflection due to a gradient of the light reflection layer pattern 107A by employing the SiON layer having the function of preventing the scattered reflection, wherein the SiON layer is used as the protection layer pattern 108A. That is, the scattered reflection of the laser that is generated by the gradient/slope of the light reflection layer pattern 107A is minimized while passing through the SiON layer that is the protection layer pattern 108A.

Further, it is possible to minimize the scattered reflection due to the gradient of the light reflection layer pattern 107A by forming the protection layer pattern 108A having the vertical profile V1 on the light reflection layer pattern 107A.

Also, it is possible to prevent a surface of the light reflection layer pattern 107A from being exposed to the air by covering the light reflection layer pattern 107A with the protection layer pattern 108A. As a result, a speed of the light reflection layer 107 reacting with the laser and being oxidized can be reduced and thus the reference wafer can have a longer usage period.

Figure 3A:
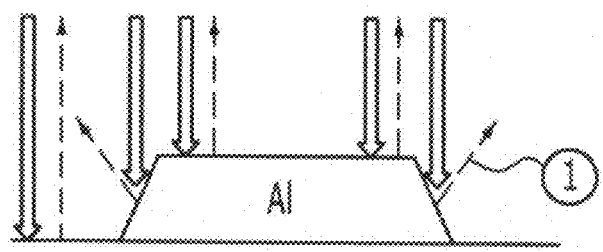
FIG. 3A illustrates a view showing a degree of scattered reflection according to the prior art.
Figure 3B:
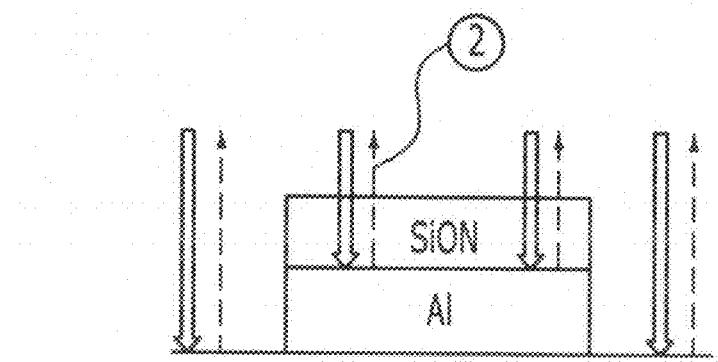
FIG. 3B illustrates a view depicting a degree of scattered reflection in accordance with the first embodiment of the present invention.

FIG. 3A illustrates a view showing a degree of scattered reflection according to the prior art. FIG. 3B illustrates a view depicting a degree of scattered reflection in accordance with the first embodiment of the present invention.

Referring to FIGS. 3A and 3B, the prior art has a problem that the accuracy is deteriorated since a slope of a sidewall of a light reflection layer is great when etching an Al layer that is the light reflection layer and thus a reflection angle 1 by an incident angle of a laser is not measured in a desired direction. On the other hand, in accordance with the first embodiment of the present invention, since a sidewall of a light reflection layer has a vertical profile when etching an Al layer that is the light reflection layer, reflection angle 2 by an incident angle of a laser is measured in a desired direction and thus the accuracy is enhanced.

Figure 4A:
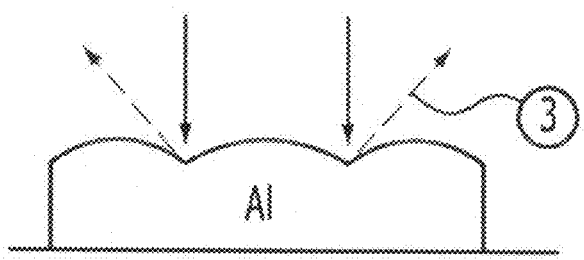
FIG. 4A illustrates a view describing a degree of scattered reflection due to a gradient of a light reflection layer according to the prior art.
Figure 4B:
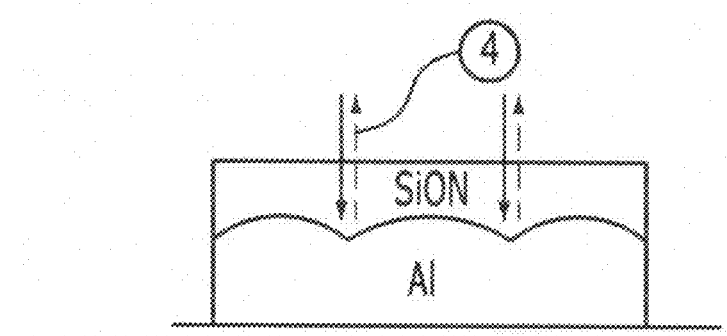
FIG. 4B illustrates a view representing a degree of scattered reflection due to a gradient of a light reflection layer in accordance with the first embodiment of the present invention.

FIG. 4A illustrates a view describing a degree of scattered reflection due to a gradient of a light reflection layer according to the prior art. FIG. 4B illustrates a view representing a degree of scattered reflection due to a gradient (which is, a sloped end or a slope caused by a grain size of the light reflection layer) of a light reflection layer in accordance with the first embodiment of the present invention.

Referring to FIGS. 4A and 4B, the prior art has a problem that the accuracy is deteriorated since a reflection angle 3 by an incident angle of a laser is not measured in a desired direction by the gradient due to a grain size of an Al layer that is the light reflection layer. On the other hand, in accordance with the first embodiment of the present invention, since a SiON layer is formed on an Al layer that is the light reflection layer, the scattered reflection of a laser that occurs by the gradient of the light reflection layer is minimized as passing through the SiON layer that is the protection layer pattern 108A. As a result, a reflection angle 4 by an incident angle of a laser is measured in a desired direction and thus the accuracy is enhanced.

FIGS. 5A to 5D illustrate cross-sectional views of a method of fabricating the reference wafer described in FIG. 2.

Figure 5A:
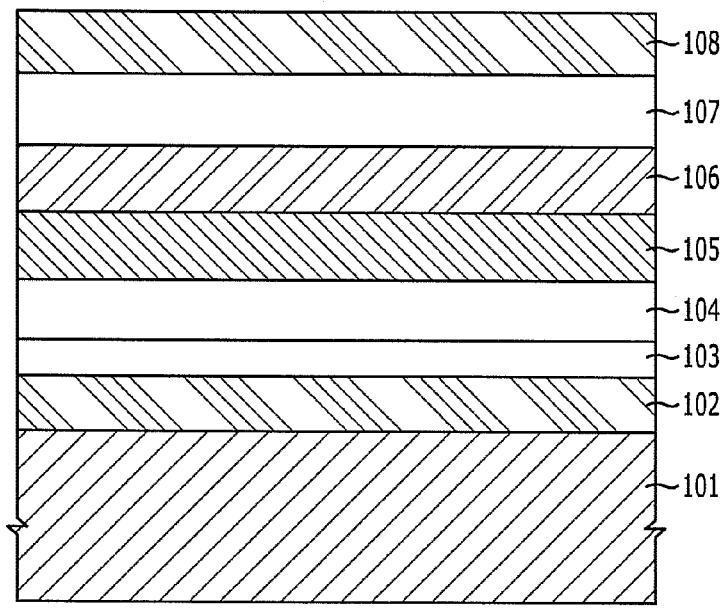
FIGS. 5A to 5D illustrate cross-sectional views of a method of fabricating the reference wafer described in FIG. 2.

Referring to FIG. 5A, the first anti-reflection layer 102, the adhesive layer 103 and 104, the light absorption layer 105 and the second anti-reflection layer 106 are sequentially stacked on the silicon substrate 101. The first anti-reflection layer 102 and the second anti-reflection layer 106 prevent the reflection of the laser and transmit the laser. For instance, the first and the second anti-reflection layers 102 and 106 may include $SiO_2$. In particular, the first anti-reflection layer 102 may include a $SiO_2$ layer having a thickness of approximately 10,000 Å and the second anti-reflection layer 106 may include a $SiO_2$ layer having a thickness of approximately 2,000 Å. The adhesive layer is provided to enhance an adhesive force between the first anti-reflection layer 102 and the light absorption layer 105. For instance, the adhesive layer may include the Ti layer 103 and the TiN layer 104. The Ti layer 103 enhances an adhesive force between the TiN layer 104 and the first anti-reflection layer 102 and the TiN layer 104 enhances an adhesive force between the Ti layer 103 and the light absorption layer 105. In case the light absorption layer 105 includes the W layer, it is well known that the adhesive layer including the Ti layer 103 and the TiN layer 104 can provide an enhanced adhesive force between the W layer and the first anti-reflection layer 102. The TiN layer 104 may have a thickness of approximately 200 Å and the Ti layer 103 may have a thickness of approximately 100 Å. Each of the Ti layer 103 and the TiN layer 104 may have a minimum thickness to provide an appropriate adhesive force. The light absorption layer 105 may absorb the laser permeating the second anti-reflection layer 106. Accordingly, it is preferred that a reflection rate of the light absorption layer 105 is low, e.g., less than 70%. For instance, the light absorption layer 105 may include the W layer having a reflection rate of less than 60%. A thickness of the light absorption layer 105 may be selected by considering warpage due to the reflection rate and stress. Preferably, the thickness of the light absorption layer 105 formed with the W layer may be approximately 1,500 Å.

Then, after forming a light reflection layer 107 on the second anti-reflection layer 106, a protection layer 108 is stacked on the light reflection layer 107. The light reflection layer 107 reflects an incident laser. For instance, the light reflection layer 107 may include a metal layer capable of reflecting higher than 90% of the incident laser. In particular, the light reflection layer 107 may include an Al layer. A thickness of the light reflection layer 107 may be determined by considering its reflection rate. The reflection rate is higher than 95% if a thickness of the Al layer is greater than approximately 1,000 Å. Therefore, the thickness of the light reflection layer 107 may be greater than approximately 1,000 Å, e.g., 4,000 Å.

The protection layer 108 prevents the light reflection layer 107 from being exposed to the air. For example, the protection layer 108 may include SiON. In particular, the protection layer 108 may be formed with a SiON layer having a thickness of approximately 100 Å to approximately 1,000 Å.

Figure 5B:
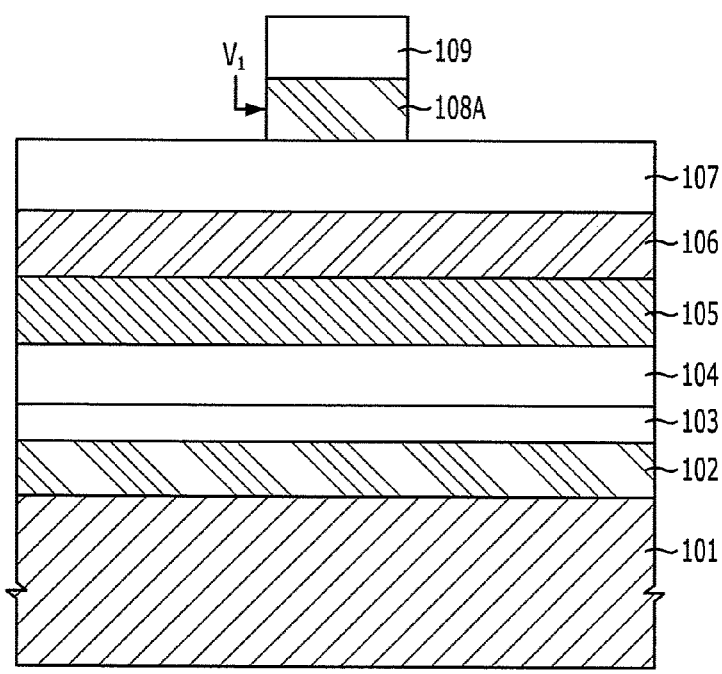

Referring to FIG. 5B, a photoresist pattern 109 is formed by coating a photoresist and performing an exposure process on the coated photoresist. At this time, the photoresist pattern 109 may be patterned to have a cross section by considering a shape of a succeeding light reflection layer pattern.

Then, the protection layer pattern 108A is formed by etching the protection layer 108 using the photoresist pattern 109 as an etch barrier. The etch condition is adjusted to make the protection layer pattern 108A have a vertical profile when etching the protection layer 108. This is to obtain a succeeding light reflection layer pattern having a vertical profile.

A method for etching the protection layer 108 to secure the vertical profile is as follows.

A more vertical profile is obtained by performing the etch process in a low pressure of approximately 10 mTorr to approximately 50 mTorr and using a relatively high bottom power of approximately 100 W to approximately 500 W.

Figure 5C:
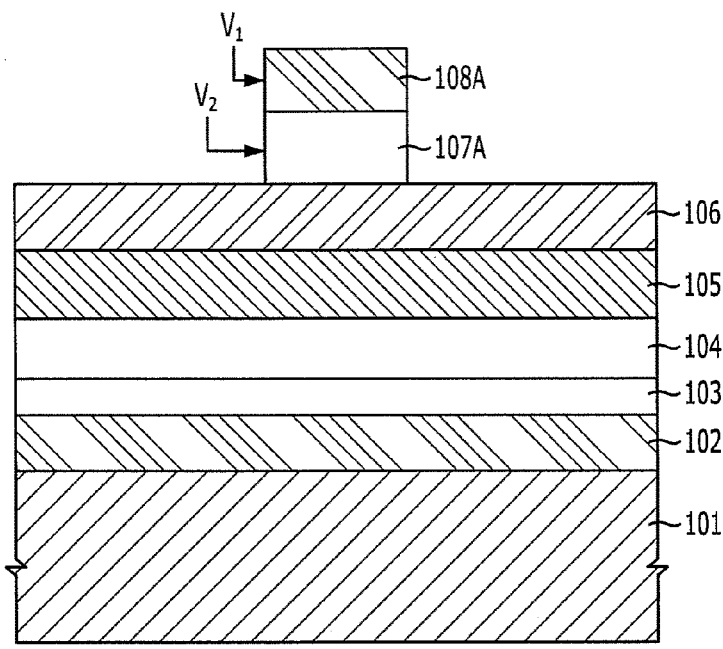

Referring to FIG. 5C, after removing the photoresist pattern 109, the light reflection layer pattern 107A where a shape of the protection layer pattern 108A is transcribed is formed by etching the light reflection layer 107. At this time, the light reflection layer pattern 107A also has a vertical profile by proceeding the etch process using the protection layer pattern 108A having the vertical profile.

In case the light reflection layer 107 is formed with the Al layer, a chlorine series gas such as $Cl_2$ is used to etch the Al layer.

Figure 5D:
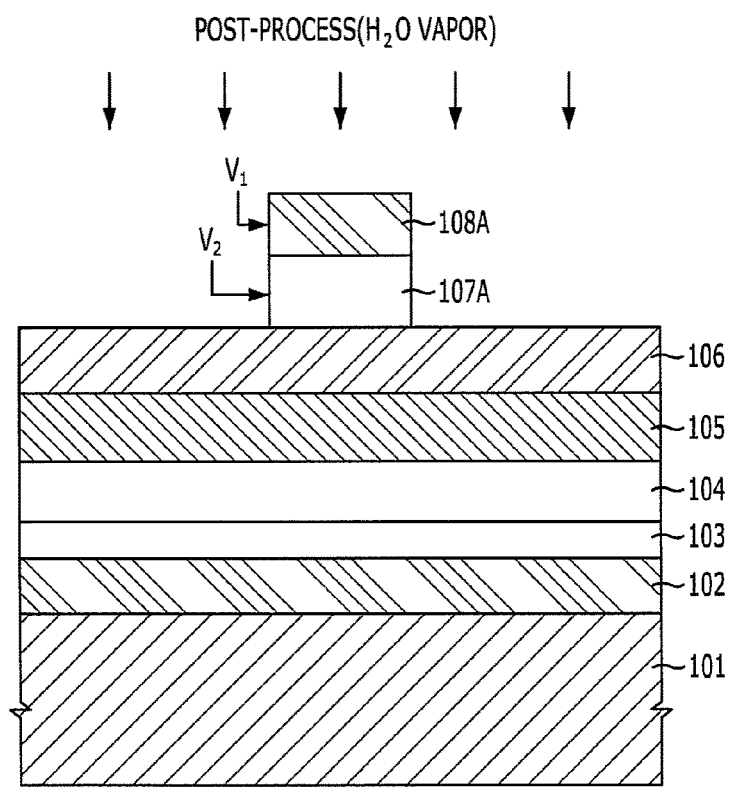

Referring to FIG. 5D, a post-treatment process is performed. At this time, the post-treatment process is performed using a $H_2O$ vapor. Since the Cl series gas remaining on a surface of the light reflection layer pattern 107A after etching the light reflection layer 107 corrodes the surface of the light reflection layer pattern 107A by reacting with hydrogen in the air, the remaining Cl series gas is removed by performing the post-treatment process using the $H_2O$ vapor in a high pressure of approximately 500 mTorr to approximately 5,000 mTorr and, preferably, approximately 3,000 mTorr to approximately 5,000 mTorr after etching the light reflection layer 107. Through the post-treatment process using the $H_2O$ vapor, the corrosion of the Al layer used for the light reflection layer pattern 107A is prevented. This could be very helpful in prolonging the usage period of the reference wafer.

FIG. 6 illustrates a view of a reference wafer for calibrating a semiconductor equipment in accordance with the second embodiment of the present invention.

Referring to FIG. 6, the reference wafer includes a first anti-reflection layer 202, an adhesive layer 203 and 204, a light absorption layer 205, a second anti-reflection layer 206, a light reflection layer pattern 207 and a micrograin layer pattern 208 that are sequentially stacked on a silicon substrate 201. The micrograin layer pattern 208 is formed with a material having a grain size smaller than that of the light reflection layer pattern 207 and thus fills a gradient of the light reflection layer pattern 207 so that the scattered reflection itself does not occur. The light reflection layer pattern 207 and the micrograin layer pattern 208 may have a cross shape in a plane view.

The first anti-reflection layer 202 and the second anti-reflection layer 206 prevent the reflection of a laser and transmit the laser. For instance, the first and the second anti-reflection layers 202 and 206 may include $SiO_2$. In particular, the first anti-reflection layer 202 may include a $SiO_2$ layer having a thickness of approximately 10,000 Å and the second anti-reflection layer 206 may include a $SiO_2$ layer having a thickness of approximately 2,000 Å.

The light absorption layer 205 may absorb the laser permeating the second anti-reflection layer 206. Accordingly, it is preferred that a reflection rate of the light absorption layer 205 is low, e.g., less than 70%. For instance, the light absorption layer 205 may include a W layer having a reflection rate of less than 60%. A thickness of the light absorption layer 205 may be selected by considering warpage due to the reflection rate and stress. Preferably, the thickness of the light absorption layer 205 formed with the W layer may be approximately 1,500 Å.

The adhesive layer is provided to enhance an adhesive force between the first anti-reflection layer 202 and the light absorption layer 205. For instance, the adhesive layer may include a Ti layer 203 and a TiN layer 204. The Ti layer 203 enhances an adhesive force between the TiN layer 204 and the first anti-reflection layer 202 and the TiN layer 204 enhances an adhesive force between the Ti layer 203 and the light absorption layer 205. In case the light absorption layer 205 includes the W layer, it is well known that the adhesive layer including the Ti layer 203 and the TiN layer 204 can provide an enhanced adhesive force between the W layer and the first anti-reflection layer 202. The TiN layer 204 may have a thickness of approximately 200 Å and the Ti layer 203 may have a thickness of approximately 100 Å. Each of the Ti layer 203 and the TiN layer 204 may have a minimum thickness to provide an appropriate adhesive force.

The micrograin layer pattern 208 is formed with a material minimizing the scattered reflection due to the gradient of the light reflection layer pattern 207. That is, the material has a grain size sufficiently smaller than that of the light reflection layer pattern 207 and thus fills any gradient of the light reflection layer pattern 207 so that the scattered reflection itself does not occur. The micrograin layer pattern 208 may include a layer containing titanium. Preferably, the micrograin layer pattern 208 may include only a Ti layer or a TiN layer, or a stacked structure of the Ti layer and the TiN layer.

The light reflection layer pattern 207 can reflect the incident laser. For instance, the light reflection layer pattern 207 may include a metal layer capable of reflecting higher than 90% of the incident laser. In particular, the light reflection layer pattern 207 may include an Al layer. A thickness of the light reflection layer pattern 207 may be determined by considering its reflection rate. The reflection rate is higher than 95% if a thickness of the Al layer is greater than approximately 1,000 Å. Therefore, the thickness of the light reflection layer pattern 207 may be greater than approximately 1,000 Å, e.g., 4,000 Å.

Specially, it is preferable that a sidewall of the light reflection layer pattern 207 has a vertical profile V2. In the reference wafer, the scattered reflection makes the detection of a location of the light reflection layer pattern 207 difficult when the laser passes the sidewall the light reflection layer pattern 207 because of a gradient of the sidewall of the light reflection layer pattern 207. As a result, a correct location waveform cannot be obtained and thus a significant error may occur when performing the calibration. Therefore, in the second embodiment of the present invention, by forming a SiON layer 209 that is a protection layer pattern whose sidewall has a vertical profile V1 (for example, vertically straight without a slant) on the light reflection layer pattern 207, the SiON layer 209 acts as an etch barrier when forming the light reflection layer pattern 207 and thus the light reflection layer pattern 207 can have the vertical profile V2. The vertical profile V2 of the light reflection layer pattern 207 can be obtained through the method of etching the protection layer, i.e., the SiON layer, in accordance with the first embodiment of the present invention. That is, after forming the protection layer pattern 209, i.e., the SiON layer, having the vertical profile V1 on a micrograin layer, the micrograin layer and a light reflection layer are etched using the SiON layer 209 as an etch barrier, wherein the micrograin layer and the light reflection layer represent layers before the micrograin layer pattern 208 and the light reflection layer pattern 207 are formed. Herein, since there are the SiON layer 209 and the micrograin layer pattern 208 preventing the scattered reflection itself, it is not necessary to use both of the micrograin layer pattern 208 and the SiON layer 209. That is, after the SiON layer 209 is used to obtain the vertical profile, it may be removed later. A sidewall of the micrograin layer pattern 208 also has a vertical profile.

According to FIG. 6, it is possible to minimize the scattered reflection of the laser due to the gradient of the light reflection layer pattern 207 by forming the sidewall of the light reflection layer pattern 207 having the vertical profile V2.

Furthermore, it is possible to prevent the scattered reflection itself by employing the micrograin layer pattern 208 whose grain size is smaller than that of the light reflection layer pattern 207 and thus filling the gradient of the light reflection layer pattern 207 with the micrograin.

It is also possible to prevent the light reflection layer pattern 207 from being exposed to the air by covering the light reflection layer pattern 207 with the micrograin layer pattern 208. As a result, a speed of the light reflection layer pattern 207 reacting with the laser and being oxidized when the laser is irradiated can be reduced and thus the reference wafer can have a longer usage period.

TABLE 1

| | Product 1 | Product 2 | Present Invention |
|---|---|---|---|
| 1st Time | 35 mm: X = 0.2545, Y = 0.2392 | 35 mm: X = 0.1786, Y = 0.1200 | 35 mm: X = 0.0924, Y = 0.0964 |
| | 50 mm: X = 0.2434, Y = 0.2408 | 50 mm: X = 0.1817, Y = 0.1239 | 50 mm: X = 0.0964, Y = 0.0801 |
| 2nd Time | 35 mm: X = 0.3995, Y = 0.2869 | 35 mm: X = 0.1433, Y = 0.1424 | 35 mm: X = 0.0862, Y = 0.0937 |
| | 50 mm: X = 0.4165, Y = 0.2976 | 50 mm: X = 0.1497, Y = 0.1491 | 50 mm: X = 0.0974, Y = 0.1013 |

Table 1 represents a result of comparing products on sale with the reference wafer in accordance with the present invention. Herein, the unit of X and Y is 'μm.'

Referring to Table 1, X and Y may have ideal values as being closer to (0, 0). As shown in Table 1, it is noted that the reference wafer of the present invention employing the SiON layer shows good results in case of both 35 mm and 50 mm that are chip sizes capable of being calibrated at one time.

In other words, it is noted that the accuracy increases as much as approximately 50 nm to approximately 100 nm in a direction of each axis. In a current situation of a semiconductor device where a wafer size is getting greater and a device size is getting smaller, it is possible to obtain a much higher product yield and a much smaller device size when fabricating the semiconductor device by more accurately calibrating the laser and the camera so as to maintain a more precise and exact status of an equipment.

In accordance with the embodiments of the present invention, it is possible to accomplish more precise calibration and to fabricate the reference wafer having a longer usage period by patterning the sidewall of the light reflection layer to have the vertical profile. Moreover, the reference wafer may have a longer usage period by minimizing the scattered reflection due to the gradient of the light reflection layer when calibrating the laser through the use of the function of preventing the scattered reflection and protecting the light reflection layer from being exposed to the air using the SiON layer formed on the light reflection layer, which results in reducing the speed of the light reflection layer directly reacting with the laser and being oxidized.

As a result, it is possible to achieve a more stable laser repair process in a much smaller fuse size by reducing a location error of the laser in a practical repair process and thus allowing more appropriate fuse blowing.

While the present invention has been described with respect to the specific embodiments, it will be apparent to those skilled in the art that various changes and modifications may be made without departing from the spirit and scope of the invention as defined in the following claims.

What is claimed is:

1. A reference wafer for calibrating a semiconductor equipment, the reference wafer comprising:
a first anti-reflection layer, an adhesive layer, a light absorption layer and a second anti-reflection layer that are stacked over a substrate;
a light reflection layer formed over the second anti-reflection layer; and
a micrograin layer formed over the light reflection layer; and
a protection layer formed over the micrograin layer.

2. The reference wafer of claim 1, wherein each of the protection layer, the micrograin layer and the light reflection layer has a sidewall of a vertical profile.

3. The reference wafer of claim 1, wherein each of the light reflection layer and the micrograin layer has a cross shape when seen from the top.

4. The reference wafer of claim 1, wherein the light reflection layer comprises an Al layer.

5. The reference wafer of claim 1, wherein the micrograin layer has a grain size smaller than that of the light reflection layer.

6. The reference wafer of claim 1, wherein the light reflection layer comprises an Al layer and the micrograin layer comprises a layer containing titanium.

7. The reference wafer of claim 1, wherein the micrograin layer comprises one of a titanium nitride (TiN) layer, a titanium (Ti) layer and a stacked structure of the TiN layer and the Ti layer.

* * * * *